(12) United States Patent
Xiong et al.

(10) Patent No.: US 10,120,585 B2
(45) Date of Patent: Nov. 6, 2018

(54) MEMORY SYSTEM OF OPTIMAL READ REFERENCE VOLTAGE AND OPERATING METHOD THEREOF

(71) Applicant: SK hynix Inc., Gyeonggi-do OT (KR)

(72) Inventors: Chenrong Xiong, San Jose, CA (US); Fan Zhang, Fremont, CA (US); Yu Cai, San Jose, CA (US); HyungSeok Kim, Santa Clara, CA (US); June Lee, Sunnyvale, CA (US); David Pignatelli, Saratoga, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/663,470

(22) Filed: Jul. 28, 2017

(65) Prior Publication Data

US 2018/0046373 A1    Feb. 15, 2018

Related U.S. Application Data

(60) Provisional application No. 62/373,227, filed on Aug. 10, 2016.

(51) Int. Cl.

| | | |
|---|---|---|
| G11C 16/10 | (2006.01) |
| G06F 3/06 | (2006.01) |
| G11C 16/08 | (2006.01) |
| G11C 16/28 | (2006.01) |
| G11C 29/02 | (2006.01) |
| G11C 29/42 | (2006.01) |
| G11C 11/56 | (2006.01) |
| G11C 16/04 | (2006.01) |

(52) U.S. Cl.
CPC ............ *G06F 3/061* (2013.01); *G06F 3/0679* (2013.01); *G11C 16/08* (2013.01); *G11C 16/10* (2013.01); *G11C 16/28* (2013.01); *G11C 29/021* (2013.01); *G11C 29/026* (2013.01); *G11C 29/028* (2013.01); *G11C 29/42* (2013.01); *G11C 11/5642* (2013.01); *G11C 16/0483* (2013.01)

(58) Field of Classification Search
CPC ................................ G11C 16/10; G11C 16/26
USPC ........................................ 365/185.03, 185.24
See application file for complete search history.

(56) References Cited

U.S. PATENT DOCUMENTS

| | | | |
|---|---|---|---|
| 9,209,835 B2 | 12/2015 | Alhussien et al. | |
| 9,417,797 B2 | 8/2016 | Chen et al. | |
| 9,620,202 B2 * | 4/2017 | Chen .................. | G11C 11/5642 |
| 2014/0036589 A1 * | 2/2014 | Parthasarathy ..... | G06F 11/1048 365/185.09 |
| 2014/0219028 A1 * | 8/2014 | Alhussien ........... | G11C 11/5642 365/185.18 |
| 2015/0127883 A1 * | 5/2015 | Chen .................. | G11C 11/5642 711/103 |

(Continued)

*Primary Examiner* — Michael Tran
(74) *Attorney, Agent, or Firm* — IP & T Group LLP

(57) ABSTRACT

An apparatus of a memory system and an operating method thereof includes a plurality of memory devices; and a controller coupled with the plurality of memory devices, configured to determine a range of read reference voltages having a plurality of read reference voltages, the read reference voltages achieving a minimal rBER; calculate an optimal read reference voltage in accordance with at least the range of read reference voltages; achieve a rBER in accordance with at least the optimal read reference voltage; and execute error correction process with at least the optimal read reference voltage.

13 Claims, 6 Drawing Sheets

(56) References Cited

U.S. PATENT DOCUMENTS

2015/0199149 A1* 7/2015 Sankaranarayanan ........................ G06F 3/0653
 711/102
2016/0179616 A1* 6/2016 Ha .................... H03M 13/2909
 714/755
2017/0004033 A1* 1/2017 Maffeis .............. H03M 13/1111

* cited by examiner

MEMORY SYSTEM OF OPTIMAL READ REFERENCE VOLTAGE AND OPERATING METHOD THEREOF

CROSS-REFERENCES TO RELATED APPLICATIONS

This application claims the benefit of U.S. Provisional Application No. 62/373,227 filed Aug. 10, 2016, the entire contents of which are incorporated herein by reference.

BACKGROUND

Field of Invention

Exemplary embodiments of the present disclosure relate to a memory system and an operating method thereof.

Description of Related Arts

In NAND flash storage systems, the read reference voltages are used to divide the possible threshold voltage range of NAND flash memory cells to several windows. A logical value is designated to each of the windows. The logical value of a cell is determined by the voltage window which the cell's threshold voltage is located in. For example, for a single-level cell (SLC), one read reference voltage is needed. When the threshold voltage of a cell is less than the specified read reference voltage, the logical value of the cell sets to "1"; otherwise, the cell's logical value sets to "0". For a multi-level cell (MLC), three read reference voltages are used. For a triple level cell (TLC) device, there are seven read reference voltages.

The threshold voltage of a cell can vary from its intended value for various reasons, such as program and read operation of neighboring cells, the number of program/erase cycles, and the retention time. Therefore, it is possible that the threshold voltage of a cell with an intended value shifts into another voltage window with a different logical value. In this case, when the cell is read, a wrong logical value is given and this error will be counted in the raw bit error rate (rBER) measurement. An optimal read reference voltage can achieve the minimal rBER.

Currently, there are two types of algorithm for the error-correction control solution, the hard-decoding algorithm and the soft-decoding algorithm. For the hard-decoding algorithm, the hard information which indicates that the input information is "0" or "1" is used. However, the soft information is used for the soft-decoding algorithm, which not only tells the decoder if the input information is "0" or "1", but also provides the decoder how likely it is "0" of "1". Usually if soft information is provided, a soft-decoding algorithm provides a better error correction performance than a hard-decoding algorithm. In NAND flash storage systems, an error-correction control solution will try the hard decoding first. When the hard decoding fails, the soft-decoding algorithm will be used.

Thus, there remains a need for a memory system and operating method thereof for locating optimal read reference voltages of the memory system.

SUMMARY

Embodiments of the present disclosure are directed to a memory system and an operating method thereof capable of locating optimal read reference voltages of the memory system.

In accordance with an embodiment, there is provided with an operating method of a memory system which includes: determining a range of read reference voltages having a plurality of read reference voltages, the read reference voltages achieving a minimal rBER; calculating an optimal read reference voltage in accordance with at least the range of read reference voltages; achieving a rBER in accordance with at least the optimal read reference voltage; and executing error correction process with at least the optimal read reference voltage.

In accordance with an embodiment, there is provided with an apparatus of a memory system which includes: a plurality of memory devices; and a controller coupled with the plurality of memory devices, configured to determine a range of read reference voltages having a plurality of read reference voltages, the read reference voltages achieving a minimal rBER; calculate an optimal read reference voltage in accordance with at least the range of read reference voltages; achieve a rBER in accordance with at least the optimal read reference voltage; and execute error correction process with at least the optimal read reference voltage.

In accordance with an embodiment, there is provided with a memory system which includes: a processor; a tangible computer readable storage medium coupled to the processor, embedding the non-transitory computer program product executed by the processor, including computer instructions configured to: determine a range of read reference voltages having a plurality of read reference voltages, the read reference voltages achieving a minimal rBER; calculate an optimal read reference voltage in accordance with at least the range of read reference voltages; achieve a rBER in accordance with at least the optimal read reference voltage; and execute error correction process with at least the optimal read reference voltage.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
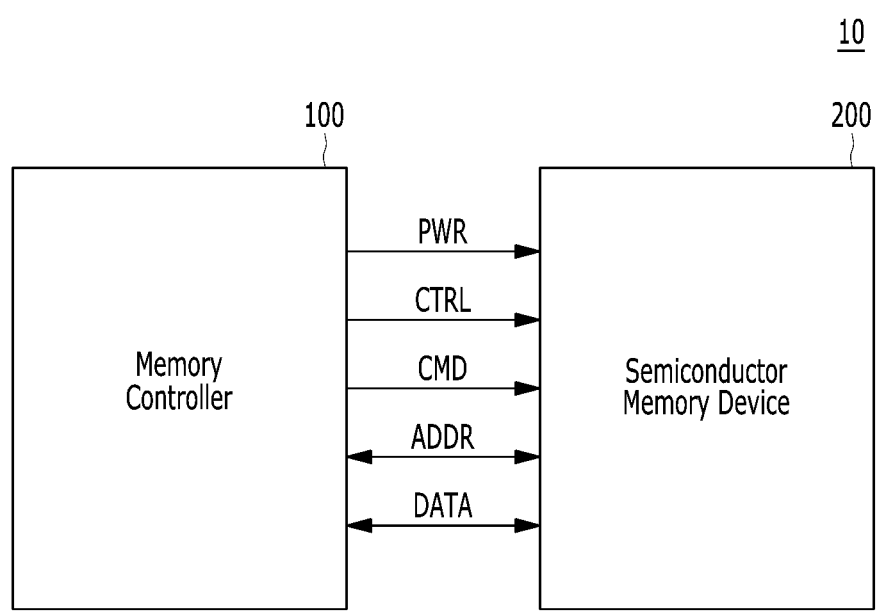
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The current method to optimize the read reference voltage is to minimize the rBER, such that the hard-decoding algorithm can achieve the best performance. However, the error correction performance of the soft-decoding algorithm depends on not only the rBER but also the distribution of log-likelihood (LLR) information. Multiple read reference voltages might provide different approximation for the LLR information distribution of channel and therefore give different error correction performance for the soft-decoding algorithm.

FIG. 1 is a block diagram schematically illustrating a memory system 10 in accordance with an embodiment of the present invention. Referring FIG. 1, the memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid-state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
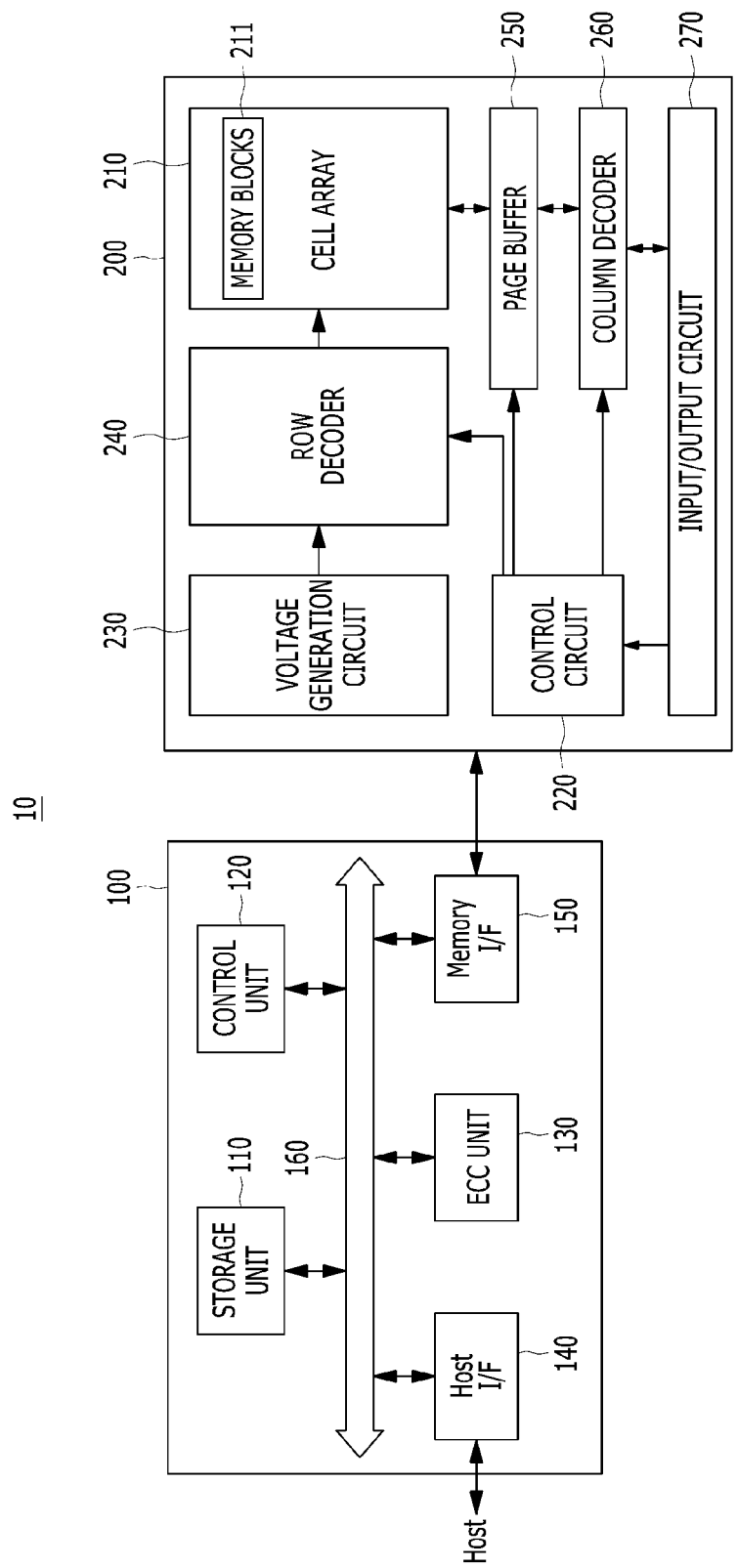
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random-access memory (DRAM) and a static random-access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random-access memory (FRAM), a phase change RAM (PRAM), a magneto resistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random-access memory (SRAM) or a dynamic random-access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220. The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270. The control circuit 220 may control the peripheral circuit in response to the command and the address.

Figure 3:
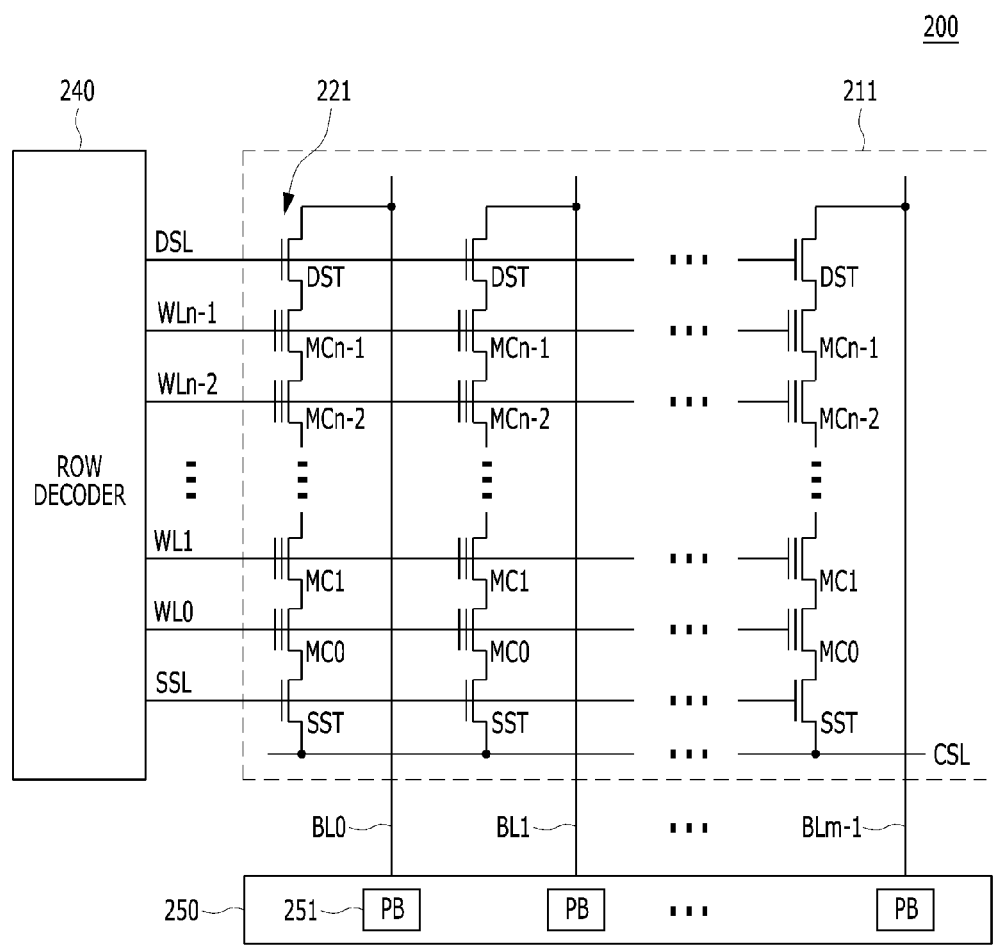
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
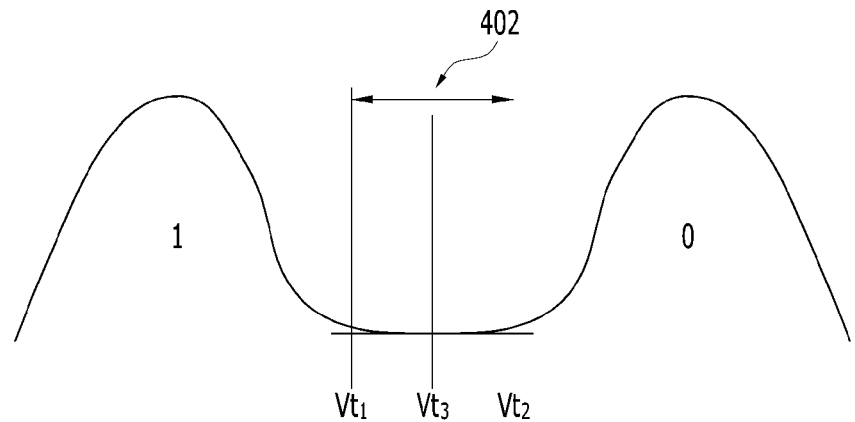
FIG. 4 is a diagram illustrating multiple optimal read reference voltages of a memory system in accordance with an embodiment of the present invention.

FIG. 4 is a diagram illustrating multiple optimal read reference voltages of a memory system in accordance with an embodiment of the present invention. The SLC is used in the example shown in FIG. 4. Assuming that the cell voltage of the SLC can have a cell voltage distribution shown in FIG. 4, and any read reference voltage between $Vt_1$ and $Vt_2$ can achieve the minimal rBER.

As shown in FIG. 4, the cell voltage distributions of value '0' and value '1' can have an overlapping area, wherein the overlapping area can be a flat area 402 having consistent or almost consistent read reference voltages. The flat area 402 can have boundaries of the read reference voltages $Vt_1$ and $Vt_2$. Any read reference voltages located within the flat area 402 can achieve the minimal rBER, wherein the minimal rBER is used to measure error rate, and a smaller minimal rBER can indicate a lower error rate. Any read reference voltages within the flat area 402, such as a read reference voltage $Vt_3$, can be the optimal read reference voltage to achieve the minimal rBER.

The cell voltage distributions of value '0' and value '1' can vary in accordance with different memory systems. The $Vt_1$ and $Vt_2$ can be acquired by various algorithms or method for defining the boundaries of the flat area 402.

Figure 5A:
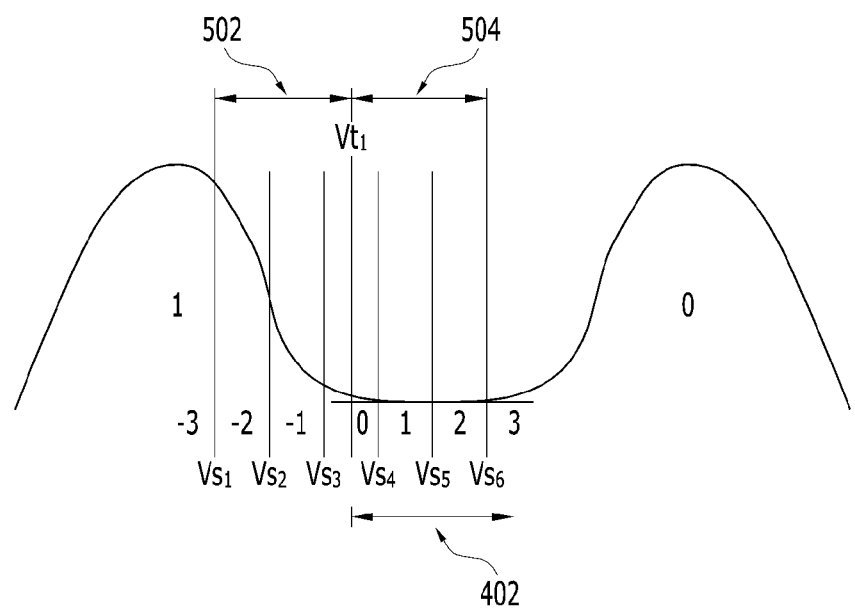
FIG. 5(a) is a diagram illustrating soft information generation with a read reference voltage $Vt_1$ of a memory system in accordance with an embodiment of the present invention.

FIG. 5(a) is a diagram illustrating soft information generation with a read reference voltage $Vt_1$ of a memory system in accordance with an embodiment of the present invention.

For the soft-decoding algorithm, the optimal read reference voltage described above in FIG. 4 can be used as a median value of soft read reference voltage. When the soft information has three bits, six soft read reference voltages, such as $Vs_1$, $Vs_2$, $Vs_3$, $Vs_4$, $Vs_5$ and $Vs_6$, can be distributed with an equal voltage interval on both sides of the optimal read reference voltage.

FIG. 5(a) shows the optimal read reference voltage $Vt_1$ and corresponding soft read reference voltages $Vs_1$, $Vs_2$, $Vs_3$, $Vs_4$, $Vs_5$ and $Vs_6$. The optimal read reference voltage $Vt_1$ can be the center of a range of the soft read reference voltages, the $Vs_1$, $Vs_2$, and $Vs_3$ can be at left side of the $Vt_1$, and the $Vs_4$, $Vs_5$, and $Vs_6$ can be at right side of the $Vt_1$. The intervals among the soft read reference voltages $Vs_1$, $Vs_2$, $Vs_3$, $Vs_4$, $Vs_5$ and $Vs_6$, can be consistent and predetermined.

When a cell has a threshold voltage less than the $Vs_1$, a value of −3 is assigned to the cell as its LLR soft information. The values of the LLR soft information from −2 to 3 can also have corresponding threshold voltage windows thereof, respectively, as shown in FIG. 5(a).

In the scenario shown in FIG. 5(a), when the optimal read reference voltage $Vt_1$ is the left boundary of the flat area 402, the $Vs_1$, $Vs_2$, and $Vs_3$ can be located in a left area 502 out of the flat area 402.

In the scenario shown in FIG. 5(a), the probability of LLR=−3 is less than the probability of LLR=3, and therefore the distribution of LLR soft information is asymmetric. Therefore, the LLR distribution of FIG. 5(a) is not a good approximation as that of FIG. 4, and may cause some decoding performance loss.

Figure 5B:
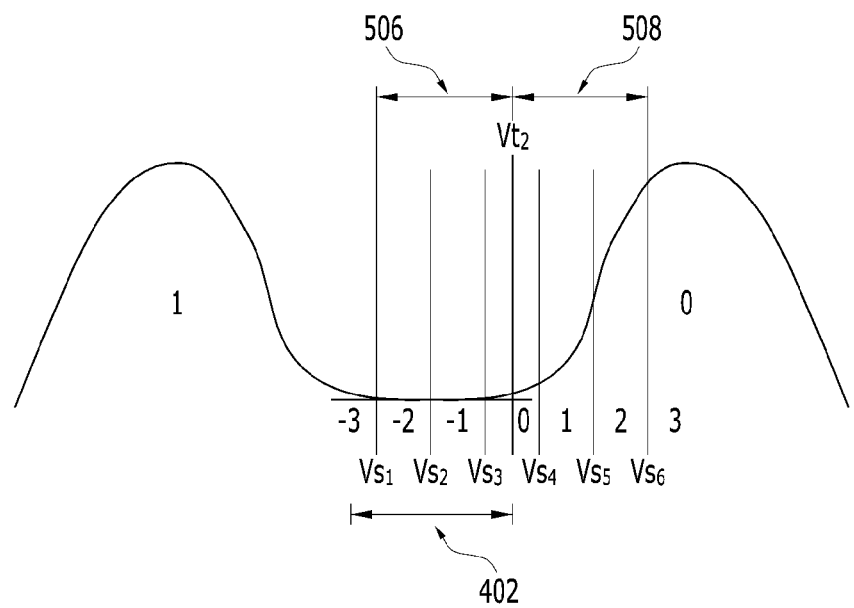
FIG. 5(b) is a diagram illustrating soft information generation with a read reference voltage $Vt_2$ of a memory system in accordance with an embodiment of the present invention.

FIG. 5(b) is a diagram illustrating soft information generation with a read reference voltage $Vt_2$ of a memory system in accordance with an embodiment of the present invention.

FIG. 5(b) shows the optimal read reference voltage $Vt_2$ and corresponding soft read reference voltages $Vs_1$, $Vs_2$, $Vs_3$, $Vs_4$, $Vs_5$ and $Vs_6$. The optimal read reference voltage $Vt_2$ can be in the center of a range of the soft read reference voltages, the $Vs_1$, $Vs_2$, and $Vs_3$ can be at left side of the $Vt_2$, and the $Vs_4$, $Vs_5$, and $Vs_6$ can be at right side of the $Vt_2$. Intervals among the soft read reference voltages $Vs_1$, $Vs_2$, $Vs_3$, $Vs_4$, $Vs_5$ and $Vs_6$, can be consistent and predetermined.

When a cell has a threshold voltage less than $Vs_1$, a value of −3 is assigned to the cell as its LLR soft information. The values of the LLR soft information from −2 to 3 can also have corresponding threshold voltage windows thereof, respectively, as shown in FIG. 5(b).

In the scenario shown in FIG. 5(b), when the optimal read reference voltage $Vt_2$ is the right boundary of the flat area 402, the $Vs_1$, $Vs_2$, and $Vs_3$ can be located in a left area 506 within the flat area 402.

In the scenario shown in FIG. 5(b), the probability of LLR=3 is less than the probability of LLR=−3, and therefore the distribution of LLR soft information is also asymmetric. Therefore, the LLR distribution of FIG. 5(b) is not a good approximation as that of FIG. 4, and may cause some decoding performance loss.

Figure 5C:
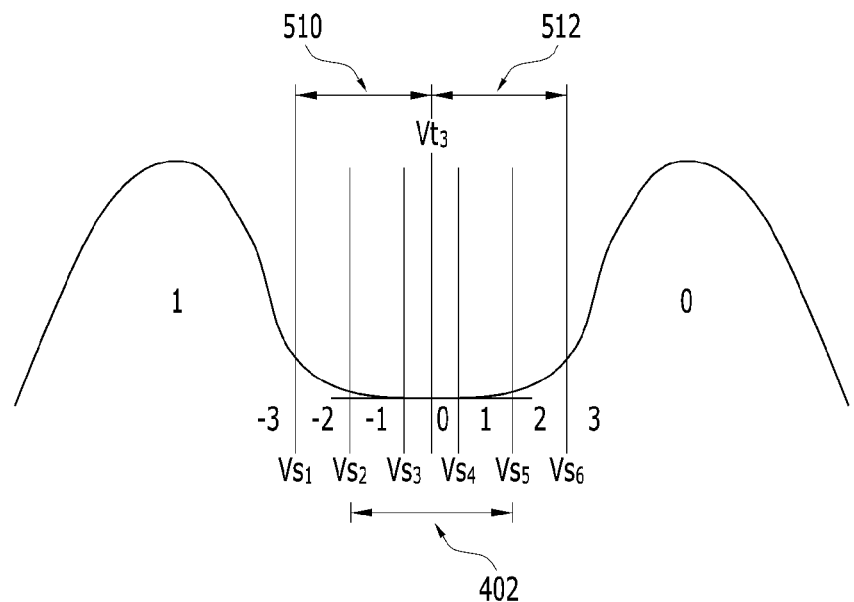
FIG. 5(c) is a diagram illustrating soft information generation with a read reference voltage $Vt_3$ of a memory system in accordance with an embodiment of the present invention.

FIG. 5(c) is a diagram illustrating soft information generation with a read reference voltage $Vt_3$ of a memory system in accordance with an embodiment of the present invention.

FIG. 5(c) shows the optimal read reference voltage $Vt_3$ and corresponding soft read reference voltages $Vs_1$, $Vs_2$, $Vs_3$, $Vs_4$, $Vs_5$ and $Vs_6$. The optimal read reference voltage $Vt_3$ can be in the center of a range of the soft read reference voltages, the $Vs_1$, $Vs_2$, and $Vs_3$ can be at left side of the $Vt_3$, and the $Vs_4$, $Vs_5$, and $Vs_6$ can be at right side of the $Vt_3$. Intervals among the soft read reference voltages $Vs_1$, $Vs_2$, $Vs_3$, $Vs_4$, $Vs_5$ and $Vs_6$, can be consistent and predetermined.

When a cell has a threshold voltage less than $Vs_1$, a value of −3 is assigned to the cell as its LLR soft information. The values of the LLR soft information from −2 to 3 can also have corresponding threshold voltage windows thereof, respectively, as shown in FIG. 5(c).

In the scenario shown in FIG. 5(c), when the optimal read reference voltage is the center of the flat area 402, the $Vs_3$ and $Vs_2$ can be located in a left area 510 within the flat area 402, and the $Vs_1$ can be out of but very close to the flat area 402.

In the scenario shown in FIG. 5(c), the LLR distribution of FIG. 5(b) is symmetric and is a good approximation as that of FIG. 4, and achieve a better performance than those shown in FIG. 5(a) and FIG. 5(b).

In the scenario shown in FIG. 5(c), when the optimal read reference voltage is $Vt_3$, the soft-decoding algorithm can achieve the best performance in accordance with the corresponding soft read reference voltages. The LLR distribution shown in FIG. 5(c) can provide a good approximation for the LLR distribution of the symmetric channel shown in FIG. 4.

The current method to locate the optimal read reference voltage is to find only one optimal read reference voltage. The optimal read reference voltage then can be used to generate the hard information, soft information, or a combination thereof. In the above scenarios shown in FIG. 5(a) and FIG. 5(b), since all the read reference voltages within the flat area 402 are the same, choosing any of the read reference voltages within the flat area 402 as the optimal read reference voltage achieve the same minimal rBER and consequently achieve the best hard-decoding performance. If the optimal read reference voltage is far away from the center of the flat area 402, the soft information corresponding to the soft read reference voltages may deviate far from the flat area 402, and may not provide a good approximation for the channel, resulting a bad soft-decoding performance.

Figure 6:
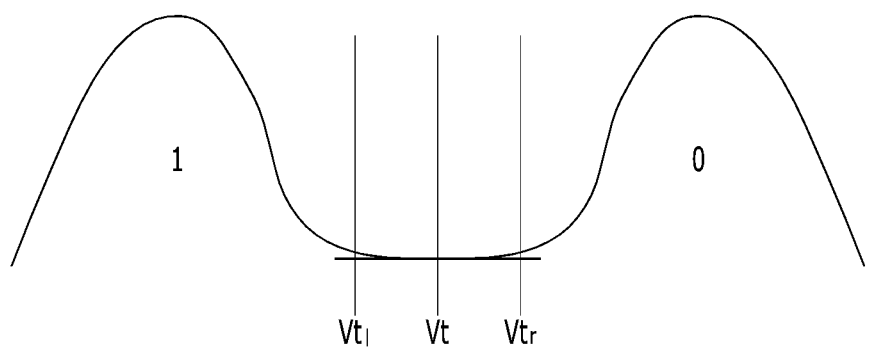
FIG. 6 is a diagram illustrating generation of an optimal read reference voltage of a memory system in accordance with an embodiment of the present invention.

FIG. 6 is a diagram illustrating generation of an optimal read reference voltage of a memory system in accordance with an embodiment of the present invention.

In the embodiment of the present invention, instead of locating only one optimal read reference voltage, the embodiment proposes to find a range of optimal read reference voltages, a left most voltage $Vt_l$, and a right most voltage $Vt_r$ of the range. An optimal read reference voltage Vt can be used as the new optimal read reference voltage to generate the hard information, the soft information, or a combination thereof, wherein $Vt=(Vt_l+Vt_r)/2$, as shown in FIG. 6.

The range of optimal read reference voltages can be defined by the left most voltage $Vt_l$, and the right most voltage $Vt_r$. Various methods or algorithms can be utilized to determine the range, the left most voltage $Vt_l$, and the right most voltage $Vt_r$. For example, an is counter can be used to count numbers of 1s corresponding to read reference voltages respectively, such as Cn, wherein n is an integer representing the iteration numbers corresponding to the read reference voltages.

Initially, when n is 0, a 1s count number of $C_0$ can be corresponding to a read reference voltage $Vt_0$ at an iteration n=0. Sequentially, a 1s count number of $C_1$ can be the corresponding to a read reference voltage $Vt_1$ at an iteration n=1. The difference between the $C_0$ and $C_1$ can be calculated as $C_1-C_0$. The calculation can be performed for numerous iterations, until $C_n-C_{n-1}$, which is the difference of two is count numbers of consecutive iterations, is close to zero. The corresponding read reference voltage $Vt_n$ can be determined as the left most voltage $Vt_l$.

Once the left most voltage $Vt_l$ is determined, the above described 1s count iterations can be continued for locating the right most voltage $Vt_r$. The difference of two 1s count numbers of consecutive iterations, such as $C_m-C_{m-1}$, can be calculated in the numerous iterations, until the $C_m-C_{m-1}$ starts increasing, wherein m is an integer representing the iteration numbers corresponding to the read reference voltages. The corresponding read reference voltage Vtm can be determined as the right most voltage $Vt_r$.

The optimal read reference voltage Vt can be calculated as $Vt=(Vt_l+Vt_r)/2$. Various methods and algorithms can be utilized for locating the parameters of the Vt, $Vt_l$, and $Vt_r$. The locating the parameters of the Vt, $Vt_1$, and $Vt_r$ can be performed during an eBoot process, typically before conducting ECC procedure.

It has been discovered that in the embodiments of the present invention, the optimal read reference voltage Vt determined by a range of the read reference voltages, can locate the optimal read reference voltage achieving the minimal rBER consistently, resulting in a lower error rate during the ECC procedure. The apparatus and operating method thereof could improve the hard-read performance, and further improve consistency of the error correction performance, and the reliability of the memory system, such as NAND flash based products.

Figure 7:
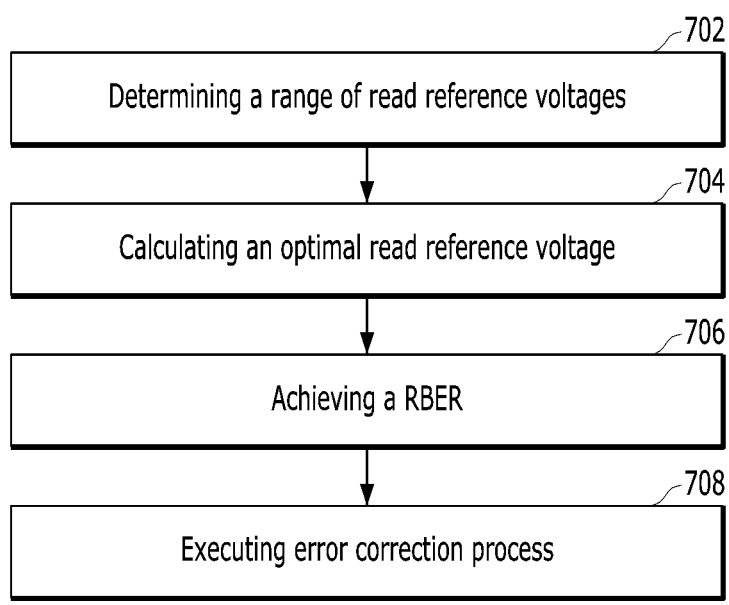
FIG. 7 is a flow chart illustrating a method of generation of an optimal read reference voltage of a memory system in accordance with a further embodiment of the present invention.

FIG. 7 is a flow chart illustrating a method of generation of an optimal read reference voltage of a memory system in accordance with a further embodiment of the present invention. The method comprising: determining a range of read reference voltages having a plurality of read reference voltages, the read reference voltages achieving a minimal rBER in a block of 702; calculating an optimal read reference voltage in accordance with at least the range of read reference voltages in a block of 704; achieving a rBER in accordance with at least the optimal read reference voltage in a block of 706; and executing error correction process with at least the optimal read reference voltage in a block of 708.

While the invention has been described in conjunction with a specific best mode, it is to be understood that many alternatives, modifications, and variations will be apparent to those skilled in the art in light of a foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An operating method of a memory system including a memory device, the operating method comprising:
    determining, using a processor of the memory system, a range for obtaining an optimal read reference voltage for reading data from a memory cell in the memory device based on a voltage distribution of the memory cell, the range being defined by a lower most voltage and an upper most voltage;
    calculating, using the processor, the optimal read reference voltage within the range based on the lower most voltage and the upper most voltage; and
    executing an error correction process, using an error correction code component and achieving an rBER in accordance with the optimal read reference voltage.

2. The method of claim 1, wherein the range is determined such that each voltage in the range, when used as a read reference voltage, is able to achieve a minimal rBER in the error correction process.

3. The method of claim 1, wherein the calculating the optimal read reference voltages includes calculating a middle point of the upper most voltage and the lower most voltage.

4. The method of claim 1, wherein the executing the error correction process includes achieving the minimal rBER in accordance with the optimal read reference voltage.

5. The method of claim 1, wherein the executing the error correction process includes generating soft information in accordance with the optimal read reference voltage.

6. The method of claim 1, wherein the executing the error correction process includes generating hard information in accordance with the optimal read reference voltage.

7. An apparatus of a memory system comprising:
a memory devices; and
a controller, coupled with the memory devices, configured to:
determine a range for obtaining an optimal read reference voltage for reading data from a memory cell in the memory device based on a voltage distribution of the memory cell, the range being defined by a lower most voltage and an upper most voltage;
calculate the optimal read reference voltage within the range based on the lower most voltage and the upper most voltage; and
execute an error correction process, achieving an rBER in accordance with the optimal read reference voltage.

8. The apparatus of claim 7, wherein the range is determined such that each voltage in the range, when used as a read reference voltage, is able to achieve a minimal rBER in the error correction process.

9. The apparatus of claim 7, wherein the controller is further configured to calculate a middle point of the upper most voltage and lower most voltage.

10. The apparatus of claim 7, wherein the controller is further configured to execute the error correction process, achieving the minimal rBER in accordance with the optimal read reference voltage.

11. The apparatus of claim 7, wherein the controller is further configured to generate soft information in accordance with the optimal read reference voltage in executing the error correction process.

12. The apparatus of claim 7, wherein the controller is further configured to generate hard information in accordance with the optimal read reference voltage in executing the error correction process.

13. A memory system, comprising:
a processor;
a tangible computer readable storage medium coupled to the processor, embedding a non-transitory computer program product for execution by the processor, including computer instructions configured to:
determine a range for obtaining an optimal read reference voltage for reading data from a memory cell in the memory device based on a voltage distribution of the memory cell, the range being defined by a lower most voltage and an upper most voltage;
calculate the optimal read reference voltage within the range based on the lower most voltage and the upper most voltage; and
execute an error correction process, achieving an rBER in accordance with the optimal read reference voltage.

* * * * *